(12) United States Patent
Hanekawa et al.

(10) Patent No.: US 9,988,303 B2
(45) Date of Patent: Jun. 5, 2018

(54) COATING FILM-EQUIPPED GLASS SUBSTRATE, AND METHOD FOR PRODUCING COATING FILM-EQUIPPED GLASS SUBSTRATE

(71) Applicant: Asahi Glass Company, Limited, Chiyoda-ku (JP)

(72) Inventors: Hiroshi Hanekawa, Chiyoda-ku (JP); Nobutaka Aomine, Chiyoda-ku (JP); Hirotomo Kawahara, Chiyoda-ku (JP); Yuki Aoshima, Chiyoda-ku (JP); Kazunobu Maeshige, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days. days.

(21) Appl. No.: 15/298,646

(22) Filed: Oct. 20, 2016

(65) Prior Publication Data
US 2017/0036948 A1    Feb. 9, 2017

Related U.S. Application Data

(63) Continuation of application No. PCT/JP2015/062145, filed on Apr. 21, 2015.

(30) Foreign Application Priority Data

Apr. 24, 2014  (JP) ................. 2014-090368

(51) Int. Cl.
*B32B 17/06*    (2006.01)
*C03C 17/245*   (2006.01)
(Continued)

(52) U.S. Cl.
CPC ........... *C03C 17/2456* (2013.01); *B32B 9/00* (2013.01); *B32B 9/04* (2013.01); *B32B 17/06* (2013.01);
(Continued)

(58) Field of Classification Search
USPC .... 428/426, 428, 432, 433, 688; 427/255.28
See application file for complete search history.

(56) References Cited

U.S. PATENT DOCUMENTS

| | | | |
|---|---|---|---|
| 5,250,328 A | 10/1993 | Otto | |
| 2003/0146709 A1 | 8/2003 | Ohta et al. | |
| 2005/0068617 A1 | 3/2005 | Mizuno et al. | |
| 2007/0279750 A1* | 12/2007 | Yaoita | G02B 1/115 |
| | | | 359/589 |

(Continued)

FOREIGN PATENT DOCUMENTS

| | | |
|---|---|---|
| JP | 11-181573 | 7/1999 |
| JP | 2003-96569 | 4/2003 |

(Continued)

OTHER PUBLICATIONS

International Search Report dated Jul. 21, 2015 in PCT/JP2015/062145, filed on Apr. 21, 2015.
Nagamedianova Z et al., "Solar heat reflective glass by nanostructured sol-gel multilayer coatings", Optical Materials, Elsevier Science Publishers B.V., Amsterdam, NL, vol. 33, No. 12, Apr. 6, 2011, pp. 1999-2005, XP028297305.
European Office Action dated Apr. 12, 2018, in European Patent Application No. 15783380.7.

(Continued)

*Primary Examiner* — Lauren R Colgan
(74) *Attorney, Agent, or Firm* — Oblon, McClelland, Maier & Neustadt, L.L.P.

(57) ABSTRACT

A glass substrate provided with a coating film, including a glass substrate and a coating film containing at least one $TiO_2$ layer having a refractive index of at least 2.20 at a wavelength of 632 nm, formed by low temperature plasma CVD method on the glass substrate, and a method for producing a glass substrate provided with a coating film, which includes forming a $TiO_2$ layer on a glass substrate by low temperature plasma CVD method using a film-forming material containing at least one member selected from an alkoxide type titanium material, an amide type titanium material and a halide type titanium material, at a plasma power density of at least 55 kW/m at a film-forming rate of from 15 to 200 nm·m/min.

14 Claims, 2 Drawing Sheets

(51) Int. Cl.
- *B32B 9/00* (2006.01)
- *B32B 9/04* (2006.01)
- *C03C 17/34* (2006.01)
- *C23C 16/40* (2006.01)
- *C23C 16/50* (2006.01)
- *C23C 16/56* (2006.01)
- *C03C 17/00* (2006.01)
- *G02B 1/11* (2015.01)

(52) U.S. Cl.
CPC .......... *C03C 17/001* (2013.01); *C03C 17/245* (2013.01); *C03C 17/34* (2013.01); *C23C 16/40* (2013.01); *C23C 16/405* (2013.01); *C23C 16/50* (2013.01); *C23C 16/56* (2013.01); *C03C 2217/212* (2013.01); *C03C 2217/73* (2013.01); *C03C 2218/153* (2013.01); *G02B 1/11* (2013.01)

(56) References Cited

U.S. PATENT DOCUMENTS

2008/0102259 A1* 5/2008 Nikolov .............. C01G 23/047
428/213

FOREIGN PATENT DOCUMENTS

| JP | 2005-107044 | 4/2005 |
| JP | 2008-37667 | 2/2008 |
| JP | 2008-201633 | 9/2008 |
| JP | 5262110 | 8/2013 |

OTHER PUBLICATIONS

J R Devore: "Refractive Indices of Rutile and Sphalerite", Journal of the Optical Society of America, vol. 41, Jun. 1, 1951, p. 416 (Abstract only).

* cited by examiner

US 9,988,303 B2

COATING FILM-EQUIPPED GLASS SUBSTRATE, AND METHOD FOR PRODUCING COATING FILM-EQUIPPED GLASS SUBSTRATE

TECHNICAL FIELD

The present invention relates to a glass substrate provided with a coating film, having a coating film containing a high refractive index titania layer formed on a glass substrate, and a method for producing a glass substrate provided with a coating film.

BACKGROUND ART

Heretofore, it has been known to alternately laminate a high refractive index layer made of a high refractive index material and a low refractive index layer made of a low refractive index material on a glass substrate to form a glass substrate provided with an optical multilayer film having a function to shut off or transmit light at a specific wavelength. Such a glass substrate provided with an optical multilayer film is used in various fields with its film designed depending upon the purpose of use.

For example, a laminated film comprising a titanium oxide layer as a high refractive index layer and a silicon oxide layer as a low refractive index layer is utilized as an antireflection film having a high visible light transmittance, a low reflectance and a high film resistance. Formation of such an optical multilayer film is usually carried out by a sputtering method, however, a titanium oxide layer formed by a sputtering method has a problem such that cracking may occur by a heat treatment when bending or tempering the glass substrate.

Accordingly, for example, Patent Document 1 discloses a substrate with an antireflection film on which no cracking will occur even when subjected to heat treatment, which comprises a high refractive index layer which is a single layer film (a) of a titanium oxynitride layer, a laminated film (b) containing a titanium oxide layer and a zirconium oxide layer or a laminated film (c) containing a titanium oxynitride layer and a zirconium oxide layer.

Further, for example, Patent Document 2 discloses a glass plate provided with an antireflection film, having an antireflection film on a glass plate, wherein the main component of a material constituting the high refractive index layer in the antireflection film is a metal oxide containing at least one member selected from the group consisting of Co, Al, Si, Zn, Zr and V.

PRIOR ART DOCUMENTS

Patent Documents

Patent Document 1: Japanese Patent No. 5262110
Patent Document 2: JP-A-2008-201633

DISCLOSURE OF INVENTION

Technical Problem

However, the method in Patent Document 1 has a problem in view of a high production cost since the number of layers to be laminated is large, and the method in Patent Document 2 is insufficient in view of performances such as the refractive index and the wavelength dispersion as compared with a case of using a titanium oxide layer.

The present invention has been made to solve the above problems and its object is to provide a glass substrate provided with a coating film having a high refractive index titania layer which is excellent in the heat resistance with cracking or the like by heat treatment suppressed and which has desired optical properties, and a method for producing such a glass substrate provided with a coating film.

Solution to Problem

The present invention provides a glass substrate provided with a coating film of the following [1] to [5] and a method for producing a glass substrate provided with a coating film of the following [6] to [11].

[1] A glass substrate provided with a coating film, comprising a glass substrate and a coating film, wherein the coating film has at least one $TiO_2$-containing layer having a $TiO_2$ content of at least 90 mass % and having a refractive index of at least 2.20 at a wavelength of 632 nm, formed by low temperature plasma CVD method.

[2] A glass substrate provided with a coating film, comprising a glass substrate and a coating film,
wherein the coating film contains at least one $TiO_2$-containing layer having a $TiO_2$ content of at least 90 mass % and a refractive index of at least 2.20 at a wavelength of 632 nm, and
wherein the $TiO_2$-containing layer is subjected to heat treatment at a temperature of at least 600° C. and at most 650° C., and has a haze of at most 0.5%.

[3] A glass substrate provided with a coating film, comprising a glass substrate and a coating film,
wherein the coating film contains at least one $TiO_2$-containing layer having a $TiO_2$ content of at least 90 mass % and a refractive index of at least 2.20 at a wavelength of 632 nm, and
wherein the $TiO_2$-containing layer is subjected to heat treatment at a temperature of higher than 650° C. and at most 700° C., and has a haze of at most 1%.

[4] The glass substrate provided with a coating film according to any one of [1] to [3], wherein the $TiO_2$-containing layer has a thickness of from 10 to 1,000 nm.

[5] The glass substrate provided with a coating film according to any one of [1] to [4], wherein the coating film has at least one layer having a refractive index of at most 1.60 at a wavelength of 632 nm and at least one $TiO_2$-containing layer as mentioned above alternately laminated.

[6] A method for producing a glass substrate provided with a coating film, which comprises a step of forming a $TiO_2$-containing layer on a glass substrate by low temperature plasma CVD method using a film-forming material containing at least one member selected from the group consisting of an alkoxide type titanium material, an amide type titanium material and a halide type titanium material, at a plasma power density of at least 55 kW/m at a film-forming rate of from 15 to 200 nm·m/m in.

[7] The method for producing a glass substrate provided with a coating film according to [6], wherein the $TiO_2$-containing layer has a refractive index of at least 2.20 at a wavelength of 632 nm.

[8] The method for producing a glass substrate provided with a coating film according to [6] or [7], which further has, after the step of forming the $TiO_2$-containing layer, a step of subjecting the glass substrate provided with the $TiO_2$-containing layer to heat treatment.

[9] The method for producing a glass substrate provided with a coating film according to [8], wherein the heat treatment is carried out at a temperature of from 600 to 700° C.

[10] The method for producing a glass substrate provided with a coating film according to any one of [6] to [9], wherein the film-forming material contains at least one member selected from the group consisting of an alkoxide type titanium material and an amide type titanium material.

[11] The method for producing a glass substrate provided with a coating film according to [10], wherein the film-forming material contains titanium tetraisopropoxide.

Advantageous Effects of Invention

According to the present invention, it is possible to provide a glass substrate provided with a coating film having a high refractive index titania layer which is excellent in the heat resistance with cracking or the like by a heat treatment suppressed and which has desired optical properties, and a method for producing such a glass substrate provided with a coating film.

DESCRIPTION OF EMBODIMENTS

Figure 1:
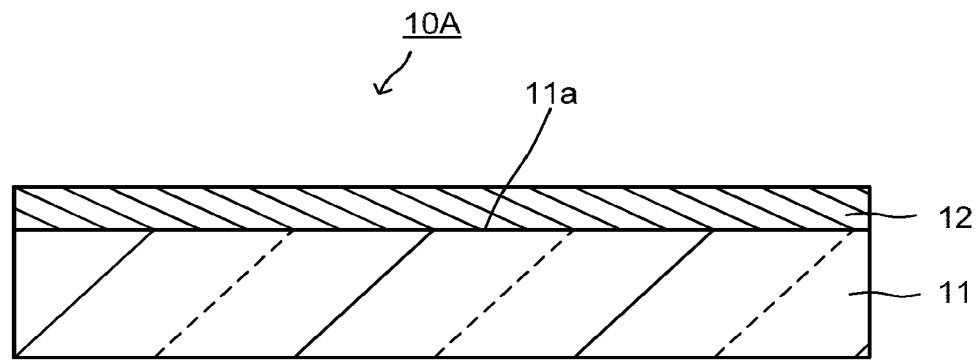
FIG. 1 is a cross sectional view schematically illustrating an example of a glass substrate provided with a coating film according to an embodiment of the present invention.

In this specification, "low temperature plasma CVD method" means a CVD (chemical vapor deposition) method of forming a film of an aimed substance on a substrate utilizing a chemical reaction of a material gas, wherein the chemical reaction of the material gas is carried out utilizing plasma generated from a plasma source. Further, the low temperature in the low temperature plasma CVD method means a temperature range such that the substrate is not positively heated by a mechanism such as a heater, for example, from 20 to 150° C.

Now, the embodiments of the present invention will be described. However, the present invention is by no means restricted to the following specific description.

[Glass Substrate Provided with Coating Film]

The glass substrate provided with a coating film according to a first embodiment of the present invention is a glass substrate provided with a coating film, comprising a glass substrate and a coating film containing at least one $TiO_2$-containing layer (provided that the content of $TiO_2$ is at least 90 mass % based on the total mass of the layer) having a refractive index of at least 2.20 at a wavelength of 632 nm formed by the low temperature plasma CVD method on the glass substrate. Hereinafter in this specification, the refractive index is a refractive index at a wavelength of 632 nm unless otherwise specified.

The glass substrate provided with a coating film according to a second embodiment of the present invention is a glass substrate provided with a coating film, comprising a glass substrate and a coating film, wherein the coating film contains at least one $TiO_2$-containing layer having a $TiO_2$ content of at least 90 mass % and a refractive index of at least 2.20, and wherein the $TiO_2$-containing layer is subjected to heat treatment at a temperature of at least 600° C. and at most 650° C. and has a haze of at most 0.5%.

The above $TiO_2$-containing layer may be formed, for example, by the low temperature plasma CVD method.

The glass substrate provided with a coating film according to a third embodiment of the present invention is a glass substrate provided with a coating film, comprising a glass substrate and a coating film, wherein the coating film contains at least one $TiO_2$-containing layer having a $TiO_2$ content of at least 90 mass % and a refractive index of at least 2.20, and wherein the $TiO_2$-containing layer is subjected to heat treatment at a temperature of higher than 650° C. and at most 700° C. and has a haze of at most 1%.

The above $TiO_2$-containing layer may be formed, for example, by the low temperature plasma CVD method.

The above $TiO_2$-containing layer is a high refractive index $TiO_2$-containing layer having a refractive index of at least 2.20, formed by the low temperature plasma CVD method, and is a $TiO_2$-containing layer which is excellent in the heat resistance with cracking or the like by a heat treatment suppressed.

Now, the glass substrate provided with a coating film of the present invention will be described with reference to the drawings.

FIG. 1 is a cross sectional view schematically illustrating an example of a glass substrate provided with a coating film according to an embodiment of the present invention.

As shown in FIG. 1, a glass substrate 10A provided with a coating film according to an embodiment of the present invention comprises a glass substrate 11, and a $TiO_2$-containing layer 12 formed on one principal plane 11a of the glass substrate 11.

The glass substrate 11 is preferably one which can fulfill a desired function when the $TiO_2$-containing layer 12 is formed thereon to form the glass substrate 10A provided with a coating film. The material of the glass substrate is not particularly limited, and may, for example, be usual soda lime glass, borosilicate glass, alkali-free glass or quartz glass.

The size of the glass substrate 11 is properly adjusted depending upon the purpose of use. The thickness of the glass substrate 11 is also properly selected depending upon the purpose of use. The thickness of the glass substrate 11 is usually from 1 to 10 mm, more preferably from 3 to 5 mm.

The $TiO_2$-containing layer 12 is formed by the low temperature plasma CVD method, and has a high refractive index of at least 2.20. The refractive index of the $TiO_2$-containing layer 12 is preferably at least 2.20, more preferably at least 2.40. The upper limit of the refractive index of the $TiO_2$-containing layer 12 is not particularly limited, and is preferably about 2.50. In order to form the $TiO_2$-containing layer 12 by the low temperature plasma CVD method, for example, the after-mentioned method may be employed.

Usually, a layer formed by the low temperature CVD process is known to have properties different from those of a layer having a high purity of the main constituent such as a film formed by sputtering, due to influences of impurities derived from an organic metal material. The reason why the $TiO_2$-containing layer 12 has excellent heat resistance is considered to be because of influences of impurities remaining in the $TiO_2$-containing layer.

The $TiO_2$-containing layer 12 may contain components other than $TiO_2$, however, the content of such other components in the $TiO_2$-containing layer 12 is at most 10 mass % based on the total mass of the $TiO_2$-containing layer 12. That is, the $TiO_2$ content in the $TiO_2$-containing layer 12 is at least 90 mass % based on the total mass of the $TiO_2$-containing layer 12. The $TiO_2$ content is preferably at least 90 mass %, more preferably at least 95 mass %. The upper limit of the $TiO_2$ content in the $TiO_2$-containing layer 12 is preferably at a level of 99 mass % from the above viewpoint of the heat resistance.

Other components in the $TiO_2$-containing layer 12 may, for example, be components derived from material components used in the low temperature plasma CVD method.

The thickness of the $TiO_2$-containing layer 12 is preferably from 10 to 1,000 nm, more preferably from 10 to 400 nm, particularly preferably from 10 to 200 nm. When the thickness of the $TiO_2$-containing layer 12 is within the above range, a glass substrate provided with a coating film having functions such as heat ray reflection can be obtained.

The glass substrate 10A provided with a coating film comprising the glass substrate 11 and one $TiO_2$-containing layer 12 formed on one principal plane 11a of the glass substrate 11 may be used, for example, as heat ray reflecting glass or color glass.

The coating film of the glass substrate provided with a coating film according to an embodiment of the present invention may consist of only one $TiO_2$-containing layer as in the glass substrate 10A provided with a coating film as shown in FIG. 1, or may be a laminated film of the $TiO_2$-containing layer and another layer. In a case where the coating film is a laminated film, the layer other than the $TiO_2$-containing layer may be one type or more. In a case where the coating film is a laminated film of the $TiO_2$-containing layer and another layer, one layer of each of several types of layers including the $TiO_2$-containing layer may be laminated, or two or more layers of each of several types of layers may be laminated in a predetermined order. The type of the layers other than the $TiO_2$-containing layer used for the laminated film, and the total number and the order of lamination of layers in the laminated film including the $TiO_2$-containing layer are not particularly limited.

In the glass substrate provided with a coating film according to an embodiment of the present invention, the coating film including the $TiO_2$-containing layer may be formed not only on one principal plane of the glass substrate but also on the other principal plane on the opposite side as the case requires. In such a case, the coating films on both sides of the glass substrate may have the same structure or different structures.

In the glass substrate provided with a coating film according to an embodiment of the present invention, a preferred constitution in a case where the coating film is a laminated film may, for example, be such that at least one $TiO_2$-containing layer mentioned above and at least one layer made of a material having a refractive index different from that of the $TiO_2$-containing layer are alternately laminated.

The coating film of the above constitution is a laminated film having a high refractive index layer made of a high refractive index material and a low refractive index layer made of a low refractive index material alternately laminated, and it is possible to impart optical functions such that it reflects or does not reflect selectively light in the above-described specific wavelength region by properly adjusting the refractive index, the number of lamination and the thickness of the layers.

A so-called optical multilayer film having the above optical functions may, for example, be specifically a visible light antireflection film, an infrared reflective film or an ultraviolet reflective film. For such an optical multilayer film, for example, a layer constitution is employed in many cases in which a high refractive index layer (for example, a layer having a refractive index of at least 2.2) and a low refractive index layer (for example, a layer having a refractive index at a level of from 1.3 to 1.6) are laminated, or a high refractive index layer (for example, a layer having a refractive index of at least 2.2), a medium refractive index layer (for example, a layer having a refractive index at a level of from 1.6 to 2.0) and a low refractive index layer (for example, a layer having a refractive index at a level of from 1.3 to 1.6) are laminated. In such an optical multilayer film, the $TiO_2$-containing layer is used usually as a high refractive index layer. For example, in a case where the $TiO_2$-containing layer and a high refractive index layer having a refractive index higher than the refractive index of the $TiO_2$-containing layer are laminated, the $TiO_2$-containing layer may be used as a low refractive index layer in some cases.

Figure 2:
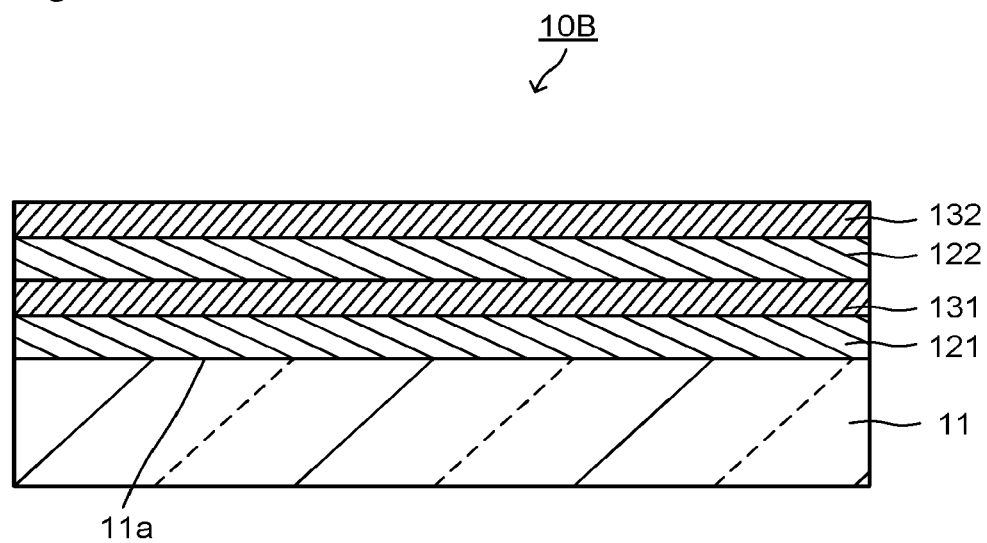
FIG. 2 is a cross sectional view schematically illustrating another example of a glass substrate provided with a coating film according to an embodiment of the present invention.

FIG. 2 is a cross sectional view schematically illustrating an example of a glass substrate provided with a coating film according to an embodiment of the present invention, wherein the coating film is an optical multilayer film having a high refractive index layer and a low refractive index layer alternately laminated.

As shown in FIG. 2, a glass substrate 10B provided with a coating film according to an embodiment of the present invention comprises a glass substrate 11, and on one principal plane 11a on the glass substrate 11, a first high refractive index layer 121, a first low refractive index layer 131, a second high refractive index layer 122 and a second low refractive index layer 132 formed in this order from the glass substrate side.

The glass substrate 11 in the glass substrate 10B provided with a coating film is the same glass substrate as the glass substrate 11 in the glass substrate 10A provided with a coating film shown in FIG. 1. At least one high refractive index layer between the first high refractive index layer 121, the first low refractive index layer 131, the second high refractive index layer 122 and the second low refractive index layer 132 is a $TiO_2$-containing layer (provided that the content of $TiO_2$ is at least 90 mass % based on the total mass of the layer, the same applies hereinafter) having a refractive index of at least 2.20, formed by the low temperature plasma CVD method. Hereinafter a $TiO_2$-containing layer having such properties will sometimes be referred to as "$TiO_2$-containing layer A".

In a case where the first high refractive index layer 121 and the second high refractive index layer 122 are high refractive index layers having a refractive index higher than the refractive index of the $TiO_2$-containing layer (for example, in a case where they are high refractive index layers having a refractive index of at least 2.6), at least one low refractive index layer is a $TiO_2$-containing layer having a refractive index at a level of from 2.2 to 2.5, formed by the low temperature plasma CVD method.

In a case where the refractive index of the first high refractive index layer 121 of the glass substrate 10B provided with a coating film is represented by $n_1$, the refractive index of the first low refractive index layer 131 by $n_2$, the refractive index of the second high refractive index layer 122 by $n_3$ and the refractive index of the second low refractive index layer 132 by $n_4$, the refractive index $n_1$ is higher than the refractive index 112, and the refractive index $n_3$ is higher than the refractive index 112 and the refractive index $n_4$.

When the relation of the refractive indices of the first high refractive index layer 121, the first low refractive index layer 131, the second high refractive index layer 122 and the second low refractive index layer 132 is within the above range, the $TiO_2$-containing layer A is used as the corresponding layer in accordance with the refractive indices of the high refractive index layers 121 and 122 and the low refractive index layers 131 and 132. For example, when the refractive index of the low refractive index layer is at most 1.6, the $TiO_2$-containing layer A is used as the high refractive index layer, and for example, when the refractive index of the high refractive index layer is at least 2.6, the $TiO_2$-containing layer A is used as the low refractive index layer.

A preferred constitution is such that the first high refractive index layer 121 and/or the second high refractive index layer 122 is the $TiO_2$-containing layer A, and a more preferred constitution is such that both the first high refractive index layer 121 and the second high refractive index layer 122 are the $TiO_2$-containing layers A Here, for example, in a case where only one of the first high refractive index layer 121 and the second high refractive index layer 122 is constituted by the $TiO_2$-containing layer A, the other layer may be constituted by a layer of a high refractive index material made of a compound such as $Ta_2O_5$ (2.22), $Nb_2O_5$ (2.3) or $ZrO_2$ (1.99). The numerical value in the bracket after the compound indicates the refractive index in a case where the compound is a pure substance. The same applies hereinafter. A layer made of such a high refractive index material may contain other components within a range where the refractive index can be kept at a high level, in the same manner as the above $TiO_2$-containing layer A.

The low refractive index material constituting the first low refractive index layer 131 and the second low refractive index layer 132 is selected so as to achieve the above relation of the refractive indices. Specifically, a material having a refractive index of at most 1.60 is preferred. That is, the low refractive index layer to be combined with the $TiO_2$-containing layer A is preferably a layer having a refractive index of at most 1.60.

The low refractive index material may, for example, be more specifically $SiO_2$ (1.46), $SiO_xN_y$ (at least 1.46 and less than 1.60) or $MgF_2$ (1.38). Among them, in the present invention, $SiO_2$ is preferred in view of reproducibility of film-forming properties, stability, economical efficiency, etc. A layer made of such a low refractive index material may also contain other components within a range where the refractive index can be kept at a low level, in the same manner as the $TiO_2$-containing layer A. Further, the low refractive index materials constituting the first low refractive index layer 131 and the second low refractive index layer 132 may be the same or different from each other.

The glass substrate 10B provided with a coating film shown in FIG. 2 illustrates an example of the constitution of the coating film such that the first high refractive index layer 121 and the second high refractive index layer 122 are the $TiO_2$-containing layers A and the first low refractive index layer 131 and the second low refractive index layer 132 are $SiO_2$-containing layers B. In the $SiO_2$-containing layer B, the content of $SiO_2$ is preferably at least 90 mass %, more preferably at least 95 mass % based on the total mass of the layer.

With respect to the film thicknesses of the first high refractive index layer 121, the first low refractive index layer 131, the second high refractive index layer 122 and the second low refractive index layer 132, the film thickness of the $TiO_2$-containing layer A is preferably from 10 to 1,000 nm, more preferably from 10 to 400 nm, particularly preferably from 10 to 200 nm. The film thicknesses of the other layers are not particularly limited and are preferably from 10 to 400 nm, more preferably from 10 to 200 nm. The film thickness of each layer is adjusted to be a predetermined value by a known method in accordance with the function required for the coating film and the refractive index of the material constituting each layer.

In the coating film of the glass substrate 10B provided with a coating film, the layers other than the $TiO_2$-containing layer A may be layers formed by the low temperature plasma CVD method or may be layers formed by another method.

However, for example, considering the heat resistance against heat treatment in a case where the glass substrate is bent or tempered in the subsequent step, the layers other than the $TiO_2$-containing layer are preferably formed by low temperature CVD, more preferably the low temperature plasma CVD method. A layer formed by low temperature CVD is considered to be excellent in the heat resistance by influences of impurities derived from an organic metal material in the same manner as the $TiO_2$-containing layer A. As mentioned above, when the coating film of the glass substrate 10B provided with a coating film is constituted only by the $TiO_2$-containing layers A formed by the low temperature plasma CVD method and layers formed by low temperature CVD or the low temperature plasma CVD method, the entire coating film has high heat resistance, on which no cracking or the like by the heat treatment in bending or tempering will occur.

The glass substrate provided with a coating film according to an embodiment of the present invention has been described with reference to the glass substrates 10A and 10B provided with a coating film shown in FIGS. 1 and 2, however, the glass substrate provided with a coating film of the present invention is by no means restricted thereto. For example, in a glass substrate provided with a coating film having a low refractive index layer and a high refractive index layer alternately laminated, such as the glass substrate 10B provided with a coating film, the coating film may have a low refractive index layer and a high refractive index layer alternately laminated in order from the glass substrate side.

So long as the coating film has at least one $TiO_2$-containing layer A, the total number of layers constituting the coating film is not limit. The total number of layers constituting the coating film is preferably from 1 to 20, more preferably from 1 to 5. Further, the total number of layers constituting the coating film may be either odd or even. That is, in a case where the coating film is a film having a low refractive index layer and a high refractive index layer alternately laminated as mentioned above, the number of the low refractive index layers and the number of the high refractive index layers are not necessarily the same. The number of layers constituting the coating film is properly selected in accordance with the function required for the coating film, while the refractive index of the material constituting each layer and the film thickness are adjusted.

The glass substrate provided with a coating film according to an embodiment of the present invention has a haze of preferably at most 1%, more preferably at most 0.5%, both in the case of a glass substrate provided with a coating film obtained by applying heat treatment in e.g. bending or tempering and in the case of a glass substrate provided with a coating film without heat treatment, after forming the coating film containing the $TiO_2$-containing layer. The heat treatment temperature depends on the type and the thickness of glass used and is usually from 600 to 700° C.

Specifically, the glass substrate provided with a coating film is preferably a glass substrate provided with a coating film obtained in such a manner that the above $TiO_2$-containing layer is formed, usually a coating film containing the TiO$_2$-containing layer is formed, or a laminated coating film containing the TiO$_2$-containing layer is formed, and then heat treatment is applied at a temperature of at least 600° C. and at most 650° C., which has a haze of at most 0.5%.

Further, the substrate provided with a coating film is preferably a glass substrate provided with a coating film obtained in such a manner that at least the TiO$_2$-containing layer is formed, usually a coating film containing the TiO$_2$-containing layer is formed, or a laminated coating film containing the TiO$_2$-containing layer is formed, and then heat treatment is applied at a temperature of higher than 650° C. and at most 700° C., which has a haze of at most 1%.

The glass substrate provided with a coating film according to an embodiment of the present invention is produced, for example, by the following method for producing a glass substrate provided with a coating film according to an embodiment of the present invention.

[Method for Producing Glass Substrate Provided with Coating Film]

The production method of the present invention is a method for producing a glass substrate provided with a coating film having a coating film containing at least one TiO$_2$-containing layer, which comprises the following step (A) and may further optionally have the following step (B).

Step (A): A step of forming a TiO$_2$-containing layer on a glass substrate by low temperature plasma CVD method using a film-forming material containing at least one member selected from the group consisting of an alkoxide type titanium material, an amide type titanium material and a halide type titanium material, at a plasma power density of at least 55 kW/m at a film-forming rate of from 15 to 200 nm·m/m in.

Step (B): A step of subjecting the glass substrate provided with a TiO$_2$-containing layer to heat treatment after the step (A).

The production method of present invention is preferably employed when a linear plasma source is employed as a plasma source. The unit [kW/m] of the plasma power density (plasma power) represents an electric energy [kW] applied per 1 m of a plasma source. Further, the unit [nm·m/min] of the film-forming rate represents the film thickness [nm] of the TiO$_2$-containing layer obtained when a glass substrate is moved at a rate of 1 m/min in a direction at a right angle to the longitudinal direction of the plasma source so that the glass substrate passes a plasma reaction site formed from the linear plasma source.

According to the method of the present invention, it is possible to produce a glass substrate provided with a coating film having a TiO$_2$-containing layer having a high refractive index and being excellent in the heat resistance, with a good production efficiency. The content of TiO$_2$ in the TiO$_2$-containing layer obtained by the method of the present invention is preferably at least 90 mass % based on the total mass of the layer. Further, the TiO$_2$ content in the TiO$_2$-containing layer is preferably at most 99 mass % from the above viewpoint of the heat resistance. The refractive index of the TiO$_2$-containing layer obtained by the method of the present invention is preferably at least 2.20, more preferably at least 2.40.

Further, even when a plasma source other than a linear plasma source is used, for example, in a case where a quadrate plasma source is employed, it is possible to produce a glass substrate provided with a coating film having a TiO$_2$-containing layer having a high refractive index and being excellent in the heat resistance, by properly adjusting the conditions so as to correspond the plasma power density and the film-forming rate in the case of the liner plasma source in the production method of the present invention. In such as case, introduction of the glass substrate is not limited to introduction by moving, and may be introduction in a state where the glass substrate is left at rest immediately below the plasma source.

Now, the step in the production method of the present invention will be described.

Step (A)

The step (A) is a step of forming a TiO$_2$-containing layer on a glass substrate by the low temperature plasma CVD method using a predetermined film-forming material under predetermined conditions.

The glass substrate used in the step (A) is the same as the glass substrate in the glass substrate provided with a coating film according to an embodiment of the present invention. The constitution of the coating film of the glass substrate provided with a coating film formed by the method of the present invention may be the same as the constitution of the above glass substrate provided with a coating film according to an embodiment of the present invention.

The TiO$_2$-containing layer by the method of the present invention may be directly formed on the principal plane of the glass substrate or may be formed on a layer other than the TiO$_2$-containing layer formed on the principal plane of the glass substrate.

The film-forming material used in the step (A) is a film-forming material containing at least one member selected from the group consisting of an alkoxide type titanium material, an amide type titanium material and a halide type titanium material. They may be used alone or in combination of two or more. Further, another component which a film-forming material to be used for forming a TiO$_2$ layer by a CVD method usually contains, may optionally be contained.

The alkoxide type titanium material may, for example, be specifically titanium tetraisopropoxide or titanium tetraethoxide. The amide type titanium material may, for example, be titanium tetrakisdimethylamide. The halide type titanium material may, for example, be titanium tetrachloride. Although the halide type titanium material has a high reactivity and a high film-forming rate will be obtained, hydrochloric acid or the like as a by-product may corrode an apparatus. Accordingly, in the method of the present invention, an alkoxide type titanium material or an amide type titanium material is preferably used. More preferably, titanium tetraisopropoxide is used.

Now, the step (A) will be described in further detail with reference to the glass substrate 10A provided with a coating film shown in FIG. 1. The step (A) may be conducted by using a conventional plasma CVD (PECVD) apparatus containing a plasma source which can achieve a plasma power density of at least 55 kW/m.

In the step (A), first, a plasma source and a glass substrate 11 are introduced into a film-forming chamber. The film-forming chamber may be in a normal pressure environment or may be in a reduced pressure environment. Then, into the film-forming chamber, oxygen gas, argon gas and the like as a gas for plasma are supplied. Here, an electric power is applied to the plasma source by a power source such as an AC power source, a DC power source or an RF power source to cause a predetermined plasma power density, thereby to convert the supplied gas for plasma into a plasma gas. Simultaneously with the supply of the gas for plasma, a material gas to be a film-forming material of the TiO$_2$-containing layer 12 is supplied into the film-forming chamber. The material gas supplied into the film-forming chamber is exposed to and reacted with the plasma gas to deposit a TiO$_2$-containing component on one principal plane 11a of the glass substrate 11 to form the TiO$_2$-containing layer 12.

Here, the supply rate (flow rate) of the gas for plasma into the film-forming chamber is preferably from 1,000 to 5,000 sccm/m, more preferably from 2,000 to 3,500 sccm/m. The supply rate of the material gas into the film-forming chamber is preferably from 100 to 1,000 sccm/m, more preferably from 200 to 500 sccm/m. The unit [sccm/m] of the supply rate of the gas for plasma means a supply amount [sccm] of the gas supplied per 1 m of the plasma source.

As the conditions of the plasma source in the step (A), the plasma power density is at least 55 kW/m. The plasma power density is more preferably at least 65 kW/m, particularly preferably at least 75 kW/m. When the plasma power density is at least 55 kW/m, a TiO$_2$-containing layer having a high refractive index and being excellent in the heat resistance can be formed at a film-forming rate without any problem in productivity.

The plasma power density is preferably higher with a view to further increasing the refractive index and with a view to increasing the film-forming rate. However, the upper limit of the plasma power density is preferably about 90 kW/min view of the resistance of the film-forming chamber, the plasma source, etc.

In the step (A), the film-forming rate of the TiO$_2$-containing layer 12 is from 15 to 200 nm·m/min. When the film-forming rate is within the above range, the production efficiency is sufficient, and a TiO$_2$-containing layer having a refractive index sufficient to achieve functions can be obtained. Particularly from the viewpoint of the productivity, the film-forming rate of the TiO$_2$-containing layer is more preferably from 40 to 200 nm·m/min, particularly preferably from 80 to 200 nm·m/min. On the other hand, particularly with a view to obtaining a high refractive index film, the film-forming rate of the TiO$_2$-containing layer is more preferably from 15 to 160 nm·m/min, particularly preferably from 15 to 80 nm·m/min. Here, the present invention will be more advantageous by selecting a suitable film-forming rate of the TiO$_2$-containing layer depending upon the productivity and the refractive index required for the TiO$_2$-containing layer. The film-forming time for forming the TiO$_2$-containing layer 12 depends on the film thickness required for the TiO$_2$-containing layer 2.

Now, the plasma source for the plasma CVD apparatus used in the above step (A) will be described. The plasma source used for the step (A) is not particularly limited so long as it is a linear plasma source which can achieve a plasma power density of at least 55 kW/m. Such a plasma source may, for example, be a plasma source, the constitution of which is schematically shown in FIG. 3.

The length of the plasma source may be optionally determined depending upon the purpose of use considering the productivity. The length of the plasma source is, for example, preferably at least 0.5 m, more preferably at least 1 m. The upper limit is at a level of 4 m.

Figure 3:
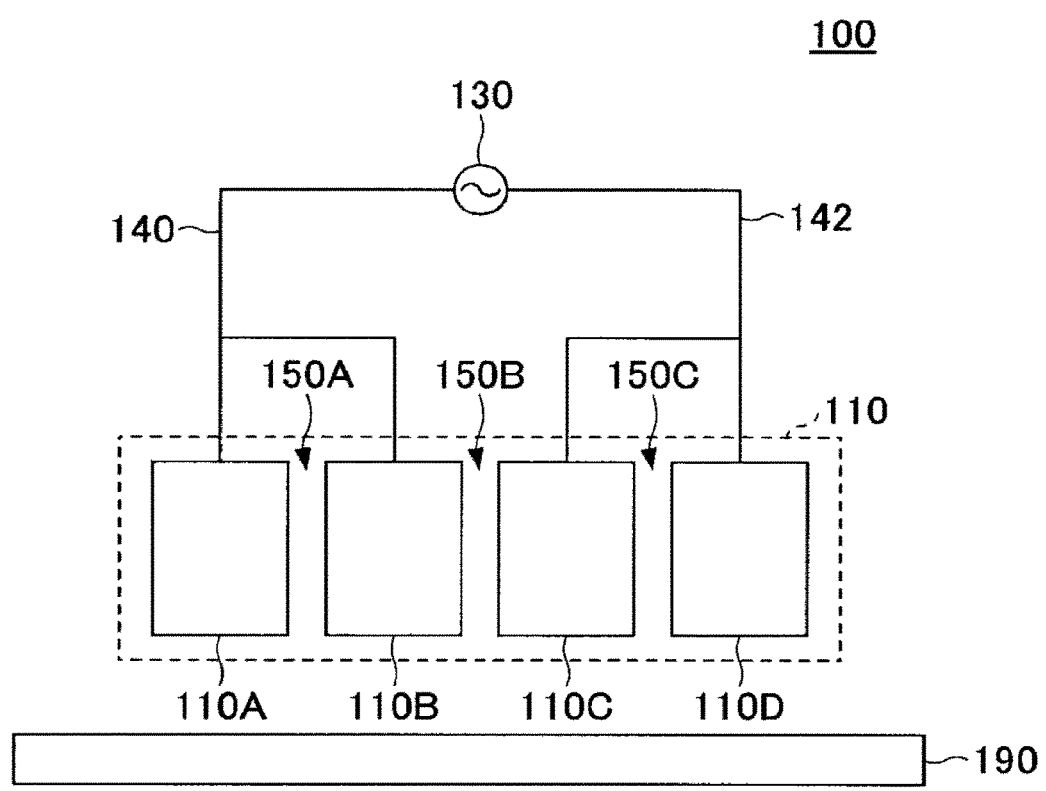
FIG. 3 is a view schematically illustrating an example of a constitution of a plasma source which can be used in the production method according to an embodiment of the present invention.

A plasma source 100 shown in FIG. 3 comprises an electrode group 110 having a first electrode 110A, a second electrode 110B, a third electrode 110C and a fourth electrode 110D aligned in this order, and the electrode group 110 is connected to an alternating current power source 130.

The alternating current power source 130 has wiring 140 for first polarity and wiring 142 for second polarity opposite to the first polarity, and the wiring 140 for first polarity is connected to the first electrode 110A and the second electrode 110B. Further, the wiring 142 for second polarity is connected to the third electrode 110C and the fourth electrode 110D.

The frequency of the alternating current power source 130 is, for example, within a range of from 5 kHz to 500 kHz.

By the plasma source 100, plasma can be formed along the direction of alignment of the electrodes 110A to 110D, for example, over 0.5 m or more.

Now, operation of the plasma source 100 will be described.

When a film is to be formed on the surface of an object 190 to be treated, for example, a TiO$_2$-containing layer 12 is to be formed on the principal plane 11a of a glass substrate 11 shown in FIG. 1, using a first plasma source 100 as shown in FIG. 3, first, an alternating voltage is applied to the respective electrodes 110A to 110D via the wirings 140 and 142 from the alternating current power source 130. Further, a gas for plasma is supplied to the vicinity of the electrode group 110.

By the above operation, polarity in the respective electrodes 110A to 110D periodically changes, and a plasma gas is generated immediately below the electrode group 110 by electric discharge between the electrodes 110A to 110D.

Then, a material gas for film-forming is supplied to a first space 150A to a third space 150C. In the description for FIG. 3, "(nth) space" means a portion formed between adjacent electrodes among paths to let the material gas flow toward the reaction region.

The supplied material gas is activated by the plasma gas formed in the vicinity of the respective electrodes 110A to 110D, whereby a chemical reaction occurs in the material gas in the vicinity of the object 190 to be treated, whereby a film can be formed on the surface of the object 190 to be treated.

In the example shown in FIG. 3, the plasma source 100 has a single alternating current power source 130, however, the power source in the plasma source 100 is not limited thereto. The plasma source 100 may have a direct current power source as the power source, or may have a plurality of alternating current power sources. For example, as a modified example of the constitution of FIG. 3, the plasma source 100 may have two alternating current power sources 130-1 and 130-2, the first alternating current power source 130-1 may be connected to the first electrode 110A and the third electrode 110C, and the second alternating current power source 130-2 may be connected to the second electrode 110B and the fourth electrode 110D. In such a case, the two alternating current power sources 130-1 and 130-2 are disposed so that the voltages applied to the first electrode 110A and the second electrode 110B are in equiphase, and the voltages applied to the third electrode 110C and the fourth electrode 110D are in equiphase.

When the plasma source 100 is used, the reactivity of the material gas supplied to the spaces 150A to 150C is increased, and the film-forming rate can be significantly increased.

The characteristic effects of the plasma source have been described with reference to the plasma source 100 having the constitution shown in FIG. 3 as an example. However, the constitution of the plasma source used in the present invention is not limited to the constitution shown in FIG. 3.

In the present invention, so long as the plasma source can achieve a plasma power density of at least 55 kW/m, the polarity of the electrode is not limited. That is, a series of electrodes constituting the electrode group is not limited to a case where "at least one pair" of adjacent electrodes is in equiphase during one period T", and may be in a case where "at least one pair of adjacent electrodes is in antiphase during one period T". However, it is apparent that a high density plasma with a plasma power density of at least 55 kW/m can readily be achieved in a case where "at least one pair of adjacent electrodes is in equiphase during one period T".

Similarly, so long as the plasma source can achieve a plasma power density of at least 55 kW/m, the constitution of the plasma source is not particularly limited. For example, the number of electrodes constituting the electrode group is not limited so long as it is at least 2, and the number of electrodes may, for example, be 2, 4, 6, 8 or 10. However, the number of electrodes is preferably from 2 to 4, more preferably 4, from the viewpoint of the resistance of the plasma source to the applied electric power and the apparatus size.

Further, in the example of FIG. 3, the direction of alignment of the respective electrodes 110A to 110D constituting the electrode group 110 is in parallel (horizontal direction) with the surface of the object 190 to be treated, however, the direction of alignment of the electrodes is not particularly limited. Further, in the example of FIG. 3, the first to third spaces 150A to 150C as the supply paths of the material gas extend in a direction perpendicular to the direction of alignment of the respective electrodes 110A to 110D constituting the electrode group 110. However, the direction of extension of the spaces 150A to 150C is not limited thereto. For example, the direction of extension of the spaces for supply paths of the material gas may have a tilt other than the right angle relative to the direction of alignment of electrodes.

As mentioned above, for example, a glass substrate 10A provided with a coating film having a TiO$_2$-containing layer 12 formed on a glass substrate 11 is obtained. In a case where the coating film is a multilayer film, and the other layers are formed by the CVD method, such a coating film can be formed in the same manner as film-forming of the TiO$_2$-containing layer except that the material gas is sequentially selected so as to achieve the desired film constitution in order from the glass substrate side.

Step (B)

It is a step of subjecting the glass substrate provided with a TiO$_2$-containing layer obtained in the above (A) to heat treatment. The step (B) may be mainly carried out by heat treatment for the purpose of bending or for tempering. The heat treatment temperature is preferably from 600° C. to 700° C. The conditions of the heat treatment, specifically, the heat treatment temperature and the time are properly selected depending upon the type and the thickness of the glass substrate and the purpose of the heat treatment. In a case where the glass substrate is not subjected to bending or tempering, the glass substrate provided with a TiO$_2$-containing layer may be subjected to heat treatment in a heating furnace for heat treatment different from a heating furnace for processing such as bending or tempering.

EXAMPLES

Now, the present invention will be described in further detail with reference to Examples. However, it should be understood that the present invention is by no means restricted to such specific Examples.

Ex. 1, 1-1, 1-2 and 1-3: Example of the Present Invention

A TiO$_2$-containing layer (hereinafter in each Ex., the TiO$_2$-containing layer will be referred to as a TiO$_2$ thin film) is formed on a substrate to prepare sample 1 by the following method. Further, sample 1 was subjected to heat treatment to prepare samples 1-1 to 1-3 and their properties were evaluated.

[Forming of TiO$_2$ Thin Film]

To form a TiO$_2$ thin film, a PECVD apparatus (low temperature plasma CVD apparatus) was used.

A plasma source and a glass substrate were introduced into a film-forming chamber, and the film-forming chamber was evacuated of air to $4.0 \times 10^{-4}$ Pa or below, and then a gas for plasma and a material gas were introduced into the film-forming chamber under the following conditions, and an electric power was applied by an AC power source to form a TiO$_2$ thin film by low temperature plasma CVD method (PECVD method).

As the gas for plasma, an oxygen gas (flow rate: 2,000 sccm/m) was used, and the plasma power density (applied electric power) was 80 kW/m. Further, as the material gas, titanium tetraisopropoxide (TTIP) was used, and the flow rate of the material gas was 200 sccm/m. As the plasma source, the same plasma source as one having the constitution shown in FIG. 3 was used.

As the glass substrate, a soda lime glass substrate having a thickness of 2 mm was used. At the time of film forming, the glass substrate was not heated. On the glass substrate, a TiO$_2$ thin film having a thickness of about 100 nm was formed. The film-forming rate calculated from the film-forming time and the thickness of the TiO$_2$ thin film was 15.9 nm·m/min. The TiO$_2$ content in the TiO$_2$ thin film was 99 mass %.

[Heat Treatment]

The obtained glass substrate 1 provided with a coating film (hereinafter referred to as "sample 1") was subjected to heat treatment to obtain the following samples 1-1, 1-2 and 1-3.

Ex. 1-1

Sample 1 was subjected to heat treatment by moving sample 1 through a small continuous belt furnace (DZ20-4-T4.4MN, manufactured by YAC DENKO CO., LTD.) kept at 650° C. at a moving rate of 70 m/min in the air to obtain sample 1-1.

Ex. 1-2

Sample 1-2 was obtained in the same manner as in Ex. 1-1 except that the furnace was kept at a temperature of 675° C.

Ex. 1-3

Sample 1-3 was obtained in the same manner as in Ex. 1-1 except that the furnace was kept at a temperature of 700° C.

[Measurement, Evaluation]

<Refractive Index>

With respect to sample 1 and sample 1-1, the refractive index of the TiO$_2$ thin film was measured by an ellipsometer (M-2000DI, manufactured by J. A. Woollam Co., Inc.).

As a result of measurement, the refractive index of sample 1 was 2.40 and the refractive index of sample 1-1 was 2.43 at a wavelength of 632 nm. The refractive indices of samples 1-2 and 1-3 are considered to be at the same level as sample 1-1. The refractive index of sample 1 as the refractive index before heat treatment and the refractive index of sample 1-1 as the refractive index after heat treatment are shown in Table 1.

<Haze>

The heat resistances of samples 1, 1-1, 1-2 and 1-3 were evaluated by comparing the hazes of these films. "Haze" is one of indices to the transparency of a sample and is employed to represent the turbidity (cloudiness) of the sample. If a drawback such as cracking occurs on the $TiO_2$ thin film by heat treatment, the turbidity of the sample decreases, whereby the haze increases. Accordingly, the heat resistance of a sample can be evaluated by measuring the haze. The haze was measured by a haze meter (Haze Meter HZ-2, manufactured by Suga Test Instruments Co., Ltd.).

As a result of measurement, the haze of sample 1-1 subjected to heat treatment at 650° C. was 0.10, and the haze of sample 1-2 subjected to heat treatment at 675° C. was 0.15. Further, the haze of sample 1-3 subjected to heat treatment at 700° C. was 0.23, and the turbidity of each of the samples after the heat treatment was very low. Further, a drawback such as cracking was not particularly confirmed on each of the $TiO_2$ thin films by visual observation. From these results, it was confirmed that substantially no defect such as cracking occurs on sample 1 by heat treatment at 650° C., 675° C. and 700° C., and sample 1 has very good heat resistance.

In Table 1 described hereinafter, the production method, the material gas spices, the plasma power density, the material flow rate, the oxygen gas flow rate and the film-forming rate when sample 1 was prepared, in "film-forming conditions" in Ex. 1, and the refractive indices before and after the heat treatment (the same applies in Ex. 1 to 7 and 11 to 13) are shown. Further, the hazes of the respective samples are shown in Table 4.

Ex. 2, 2-1, 2-2 and 2-3: Example of the Present Invention

A glass substrate 2 provided with a coating film (hereinafter referred to as "sample 2") was prepared in the same manner as in Ex. 1 except that the flow rate of titanium tetraisopropoxide as the material gas was 250 sccm/m. Further, in the same manner as in the case of sample 1, sample 2 was subjected to heat treatment to prepare samples 2-1, 2-2 and 2-3. Using these samples, measurement and evaluation were carried out in the same manner as in Ex. 1.

Further, with respect to sample 2, the film-forming rate calculated from the film-forming time and the thickness of the $TiO_2$ thin film was 45.7 nm·m/min. The $TiO_2$ content of the $TiO_2$ thin film was 98 mass %. The production conditions when sample 2 was prepared, the film thickness (thickness of layer) and the refractive index are shown in Table 1, and the hazes of the respective samples are shown in Table 4.

Ex. 3, 3-1, 3-2 and 3-3: Example of the Present Invention

A glass substrate 3 provided with a coating film (hereinafter referred to as "sample 3") was prepared in the same manner as in Ex. 1 except that titanium tetrachloride ($TiCl_4$) was used as the material gas, the flow rate of the material gas was 450 sccm/m, and the flow rate of the oxygen gas was 3,000 sccm/m. Further, in the same manner as in the case of sample 1, sample 3 was subjected to heat treatment to prepare samples 3-1, 3-2 and 3-3. Using these samples, the same evaluation as in Ex. 1 was carried out.

With respect to the sample 3, the film-forming rate calculated from the film-forming time and the thickness of the $TiO_2$ thin film was 146.0 nm·m/min. The $TiO_2$ content in the $TiO_2$ thin film was 99 mass %. The production conditions when sample 3 was prepared, the film thickness and the refractive index are shown in Table 1. Further, the hazes of the respective samples are shown in Table 4.

Ex. 4, 4-1, 4-2 and 4-3: Example of the Present Invention

In the same manner as in Ex. 1, a $TiO_2$ thin film (thickness: 10 nm) was formed on a glass substrate, and on the $TiO_2$ thin film, a $SiO_2$ thin film (thickness: 35 nm) was formed by using a plasma source having the constitution as shown in FIG. 3, using as the material gas TMDSO (1,1,3,3-tetramethoxydisiloxane) (flow rate: 150 sccm/m), using as the gas for plasma an oxygen gas (flow rate: 3,500 sccm/m) at a plasma power density of 80 kW/m.

Further, one $TiO_2$ thin film (thickness: 110 nm) was formed thereon and further one $SiO_2$ thin film (thickness: 80 nm) was formed thereon respectively by the above method to prepare a glass substrate 4 provided with a coating film (hereinafter referred to as "sample 4") having an antireflection function. Further, in the same manner as in the case of sample 1, sample 4 was subjected to heat treatment to prepare samples 4-1, 4-2 and 4-3. Using these samples, evaluation was carried out in the same manner as in Ex. 1.

With respect to sample 4, the film-forming rates calculated from the film-forming times and the thicknesses of the $TiO_2$ thin film and the $SiO_2$ thin film were respectively 15.9 nm·m/min and 149.6 nm·m/min. The $TiO_2$ content in the $TiO_2$ thin film was 99 mass %. The $SiO_2$ content in the $SiO_2$ thin film was 99 mass %. The production conditions when sample 4 was prepared, the film thickness and the refractive index are shown in Table 1, and the hazes of the respective samples are shown in Table 4.

Ex. 5, 5-1, 5-2 and 5-3: Example of the Present Invention

A glass substrate 5 provided with a coating film (hereinafter referred to as "sample 5") was prepared in the same manner as in Ex. 4 except that titanium tetrachloride ($TiCl_4$) was used as the material gas, the flow rate of the material gas was 450 sccm/m, and the flow rate of the oxygen gas was 3,000 sccm/m.

With respect to the sample 5, the film-forming rate calculated from the film-forming time and the thickness of the $TiO_2$ thin film was 146.0 nm·m/min. The $TiO_2$ content in the $TiO_2$ thin film was 99 mass %. Further, in the same manner as in the case of sample 1, sample 5 was subjected to heat treatment to prepare samples 5-1, 5-2 and 5-3. Using these samples, evaluation was carried out in the same manner as in Ex. 1. The production conditions when sample 5 was prepared, the film thickness and the refractive index are shown in Table 1, and the hazes of the respective samples are shown in Table 4.

Ex. 6, 6-1, 6-2 and 6-3: Comparative Example

In the same manner as in Ex. 1, a $TiO_2$ thin film was formed on a glass substrate to prepare a glass substrate 6 provided with a coating film (hereinafter referred to as "sample 6"). Further, in the same manner as in the case of sample 1, sample 6 was subjected to heat treatment to prepare samples 6-1, 6-2 and 6-3. Using these samples, their properties were evaluated in the same manner as in Ex. 1. However, in this Ex. 6, as the plasma source, a plasma source with two electrodes was employed, and the plasma power density was 40 kW/m. The other conditions were the same as in Ex. 1. On that occasion, the film-forming rate calculated from the film-forming time and the thickness of the $TiO_2$ thin film was 10.5 nm·m/min. The $TiO_2$ content in the $TiO_2$ thin film was 98 mass %. The production conditions when sample 6 was prepared, the film thickness and the refractive index are shown in Table 2 in the same manner as in Table 1, and the hazes of the respective samples are shown in Table 4.

Ex. 7, 7-1, 7-2 and 7-3: Comparative Example

In the same manner as in Ex. 2, a $TiO_2$ thin film was formed on a glass substrate to prepare a glass substrate 7 provided with a coating film (hereinafter referred to as "sample 7"). Further, in the same manner as in the case of sample 1, sample 7 was subjected to heat treatment to prepare samples 7-1, 7-2 and 7-3. Using these samples, their properties were evaluated in the same manner as in Ex. 1. However, in this Ex. 7, as the plasma source, a plasma source having two electrodes was employed, and the plasma power density was 40 kW/m. The other conditions were the same as in Ex. 2. On that occasion, the film-forming rate calculated from the film-forming time and the thickness of the $TiO_2$ thin film was 38.9 nm·m/min. The $TiO_2$ content in the $TiO_2$ thin film was 98 mass %. The production conditions when sample 7 was prepared, the film thickness and the refractive index are shown in Table 2, and the hazes of the respective samples are shown in Table 4.

Ex. 8, 8-1, 8-2 and 8-3: Comparative Example

A $TiO_2$ thin film was formed on a glass substrate to prepare a glass substrate provided with a coating film (hereinafter referred to as "sample 8") by the following method. Further, in the same manner as in the case of sample 1, sample 8 was subjected to heat treatment to prepare samples 8-1, 8-2 and 8-3. Using these samples, evaluation was carried out in the same manner as in Ex. 1.
[Forming of $TiO_2$ Thin Film]
To form the $TiO_2$ thin film, a sputtering apparatus was used. A glass substrate and a sputtering cathode employing Ti as the target were introduced into a vacuum chamber, the vacuum chamber was evacuated of air to $4.0\times10^{-4}$ Pa or below, and then a plasma gas was introduced, and plasma discharge was carried out by an AC power source to form the $TiO_2$ thin film. The plasma gas was a mixed gas of an oxygen gas (300 sccm/m) and an argon gas (600 sccm/m), and the plasma power density was 30 kW/m.

As the glass substrate, a soda lime glass substrate having a thickness of 2 mm was used. At the time of film forming, the substrate was not heated. On the glass substrate, a $TiO_2$ thin film having a thickness of about 100 nm was formed. The film-forming rate calculated from the film-forming time and the thickness of the $TiO_2$ thin film was 4.9 nm·m/min.

The production conditions (the sputtering target, the plasma power density, the argon gas flow rate, the oxygen gas flow rate and the film-forming rate) when sample 8 was prepared, and the film thickness and the refractive indices (the same applies in Ex. 9 and 10) are shown in Table 3, and the hazes of the respective samples are shown in Table 4.

Ex. 9, 9-1, 9-2 and 9-3: Comparative Example

A $TiO_2$ thin film was formed on a glass substrate to prepare a glass substrate 9 provided with a coating film (hereinafter referred to as "sample 9") in the same manner as in Ex. 8 except that the sputtering target was TiOx (1<X<2), and the plasma gas was a mixed gas of an oxygen gas (30 sccm·m) and an argon gas (360 sccm/m). Further, in the same manner as in the case of sample 1, sample 9 was subjected to heat treatment to prepare samples 9-1, 9-2 and 9-3. Using these samples, their properties were evaluated in the same manner as in Ex. 1. The production conditions when sample 9 was prepared, the film thickness and the refractive index are shown in Table 3, and the hazes of the respective samples are shown in Table 4.

Ex. 10, 10-1, 10-2 and 10-3: Comparative Example

By the following method, a $TiO_2$ thin film and a $SiO_2$ thin film were formed in the order of $TiO_2$ thin film/$SiO_2$ thin film/$TiO_2$ thin film/$SiO_2$ thin film on a glass substrate by using a sputtering apparatus to prepare the glass substrate 10 provided with a coating film (hereinafter referred to as "sample 10") by the following method. Further, in the same manner as in the case of sample 1, sample 10 was subjected to heat treatment to prepare samples 10-1, 10-2 and 10-3. Using these samples, their properties were evaluated in the same manner as in Ex. 1. The production conditions when sample 10 was prepared, the film thicknesses of the respective layers and the refractive index are shown in Table 3, and the hazes of the respective samples are shown in Table 4.
[Forming of $TiO_2$ Thin Film]
Using a sputtering cathode employing TiOx (1<X<2) as a target, the vacuum chamber was evacuated of air to $4.0\times10^{-4}$ Pa or below, and then a plasma gas was introduced, and plasma discharge by an AC power source was carried out to form a $TiO_2$ thin film. The plasma gas was a mixed gas of an oxygen gas (30 sccm/m) and an argon gas (360 sccm/m), and the plasma power density was 30 kW/m.
[Forming of $SiO_2$ Thin Film]
Using a sputtering cathode employing Si as the target, the vacuum chamber was evacuated of air to $4.0\times10^{-4}$ Pa or below, and then a plasma gas was introduced, and plasma discharge by an AC power source was carried out to form a $SiO_2$ thin film. The plasma gas was a mixed gas of an oxygen gas (300 sccm/m) and an argon gas (600 sccm/m), and the plasma power density was 30 kW/m.

Ex. 11, 11-1, 11-2 and 11-3: Example of the Present Invention

A glass substrate 11 provided with a coating film (hereinafter referred to as sample 11) is prepared in the same manner as in Ex. 1 except that the plasma power density is 75 kW/m. Further, in the same manner as in the case of sample 1, sample 11 is subjected to heat treatment to prepare samples 11-1, 11-2 and 11-3. Using these samples, their properties are evaluated in the same manner as in Ex. 1. With respect to sample 11, the film-forming rate is 18.2 nm·m/min. Further, the $TiO_2$ content in the $TiO_2$ thin film is 98 mass %. The production conditions when sample 11 is prepared, the film thickness and the refractive index are shown in Table 2, and the hazes of the respective samples are shown in Table 4.

Ex. 12, 12-1, 12-2 and 12-3: Example of the Present Invention

A glass substrate 12 provided with a coating film (hereinafter referred to as sample 12) is prepared in the same manner as in Ex. 1 except that the plasma power density is 65 kW/m. Further, in the same manner as in the case of sample 1, sample 12 is subjected to heat treatment to prepare samples 12-1, 12-2 and 12-3. Using these samples, their properties are evaluated in the same manner as in Ex. 1. With respect to sample 12, the film-forming rate is 19.0 nm·m/min. Further, the $TiO_2$ content in the $TiO_2$ thin film is 98 mass %. The production conditions when sample 12 is prepared, the film thickness and the refractive index are shown in Table 2, and the hazes of the respective samples are shown in Table 4.

Ex. 13, 13-1, 13-2 and 13-3: Example of the Present Invention

A glass substrate 13 provided with a coating film (hereinafter referred to as sample 13) is prepared in the same manner as in Ex. 1 except that the plasma power density is 55 kW/m. Further, in the same manner as in the case of sample 1, sample 12 is subjected to heat treatment to prepare samples 13-1, 13-2 and 13-3. Using these samples, their properties are evaluated in the same manner as in Ex. 1. With respect to sample 13, the film-forming rate is 22.5 nm·m/min. Further, the $TiO_2$ content in the $TiO_2$ thin film is 98 mass %. The production conditions when sample 13 is prepared, the film thickness and the refractive index are shown in Table 2, and the hazes of the respective samples are shown in Table 4.

TABLE 1

| | Sample | | 1 | 2 | 3 | 4 | | 5 | |
|---|---|---|---|---|---|---|---|---|---|
| | Coating film constitution | | $TiO_2$ single layer film | $TiO_2$ single layer film | $TiO_2$ single layer film | Antireflection film | | Antireflection film | |
| | | | $TiO_2$ | $TiO_2$ | $TiO_2$ | $TiO_2/SiO_2/TiO_2/SiO_2$ | | $TiO_2/SiO_2/TiO_2/SiO_2$ | |
| | Thickness of layer [nm] | | 100 | 100 | 100 | 10/35/110/80 | | 10/35/110/80 | |
| Film-forming conditions | Production method | | | | | PECVD method | | | |
| | Material gas | | TTIP | TTIP | $TiCl_4$ | TMDSO | TTIP | TMDSO | $TiCl_4$ |
| | Plasma power density | kW/m | 80 | 80 | 80 | 80 | 80 | 80 | 80 |
| | Material flow rate | sc cm/m | 200 | 250 | 450 | 150 | 200 | 150 | 450 |
| | Oxygen gas flow rate | sc cm/m | 2000 | 2000 | 3000 | 3500 | 2000 | 3500 | 3000 |
| | Film-forming rate | nm m/min | 15.9 | 45.7 | 146.0 | 149.6 | 15.9 | 149.6 | 146.0 |
| | Refractive index before heat treatment | | 2.40 | 2.21 | 2.36 | 1.46 | 2.40 | 1.46 | 2.40 |
| | Refractive index after heat treatment | | 2.43 | 2.27 | 2.38 | 1.47 | 2.43 | 1.47 | 2.38 |

In Table 1, with respect to samples 4 and 5, the left column illustrates the production conditions when sample 4 or 5 was prepared, the film thickness and the refractive index with respect to the $SiO_2$ thin film, and the right column illustrates those with respect to the $TiO_2$ thin film.

TABLE 2

| | Sample | | 6 | 7 | 11 | 12 | 13 |
|---|---|---|---|---|---|---|---|
| | Coating film constitution | | $TiO_2$ single layer film | $TiO_2$ single layer film | $TiO_2$ single layer film | $TiO_2$ single layer film | $TiO_2$ single layer film |
| | | | $TiO_2$ | $TiO_2$ | $TiO_2$ | $TiO_2$ | $TiO_2$ |
| | Thickness of layer [nm] | | 100 | 100 | 100 | 100 | 100 |
| Film-forming conditions | Production method | | | | PECVD | | |
| | Material gas | | TTIP | TTIP | TTIP | TTIP | TTIP |
| | Plasma power density | kW/m | 40 | 40 | 75 | 65 | 55 |
| | Material flow rate | sc cm/m | 200 | 250 | 200 | 200 | 200 |
| | Oxygen gas flow rate | sc cm/m | 2000 | 2000 | 2000 | 2000 | 2000 |
| | Film-forming rate | nm m/min | 10.5 | 38.9 | 18.2 | 19.0 | 22.5 |
| | Refractive index before heat treatment | | 2.10 | 1.80 | 2.36 | 2.29 | 2.21 |
| | Refractive index after heat treatment | | 2.16 | 1.86 | 2.39 | 2.31 | 2.25 |

TABLE 3

| | Sample | | 8 | 9 | 10 | |
|---|---|---|---|---|---|---|
| | Coating film constitution | | $TiO_2$ single layer film | $TiO_2$ single layer film | Antireflection film | |
| | | | $TiO_2$ | $TiO_2$ | $TiO_2/SiO_2/TiO_2/SiO_2$ | |
| | Thickness of layer [nm] | | 100 | 100 | 10/35/110/80 | |
| Film-forming conditions | Production method | | | Sputtering | | |
| | Sputtering target | | Ti | TiOx | Si | TiOx |
| | Plasma power density | kW/m | 30 | 30 | 30 | 30 |
| | Argon gas flow rate | sc cm/m | 600 | 360 | 600 | 360 |
| | Oxygen gas flow rate | sc cm/m | 300 | 30 | 300 | 30 |
| | Film-forming rate | nm m/min | 5.0 | 37.5 | 41.5 | 37.5 |
| | Refractive index before heat treatment | | 2.40 | 2.42 | 1.46 | 2.42 |
| | Refractive index after heat treatment | | 2.43 | 2.45 | 1.46 | 2.45 |

In Table 3, with respect to sample 10, the left column illustrates the production conditions when sample 10 was prepared, the film thickness and the refractive index with respect to the SiO$_2$ thin film, and the right column illustrates those with respect to the TiO$_2$ thin film.

TABLE 4

| | Haze before treatment [%] | | Heat treatment temperature [° C.] | Haze after treatment [%] |
|---|---|---|---|---|
| Ex. 1 | 0.07 | Ex. 1-1 | 650 | 0.10 |
| | | Ex. 1-2 | 675 | 0.15 |
| | | Ex. 1-3 | 700 | 0.23 |
| Ex. 2 | 0.04 | Ex. 2-1 | 650 | 0.06 |
| | | Ex. 2-2 | 675 | 0.10 |
| | | Ex. 2-3 | 700 | 0.24 |
| Ex. 3 | 0.05 | Ex. 3-1 | 650 | 0.18 |
| | | Ex. 3-2 | 675 | 0.29 |
| | | Ex. 3-3 | 700 | 0.47 |
| Ex. 4 | 0.08 | Ex. 4-1 | 650 | 0.09 |
| | | Ex. 4-2 | 675 | 0.11 |
| | | Ex. 4-3 | 700 | 0.35 |
| Ex. 5 | 0.08 | Ex. 5-1 | 650 | 0.14 |
| | | Ex. 5-2 | 675 | 0.46 |
| | | Ex. 5-3 | 700 | 0.39 |
| Ex. 6 | 0.04 | Ex. 6-1 | 650 | 0.06 |
| | | Ex. 6-2 | 675 | 0.10 |
| | | Ex. 6-3 | 700 | 0.24 |
| Ex. 7 | 0.05 | Ex. 7-1 | 650 | 0.06 |
| | | Ex. 7-2 | 675 | 0.08 |
| | | Ex. 7-3 | 700 | 0.19 |
| Ex. 8 | 0.04 | Ex. 8-1 | 650 | 1.52 |
| | | Ex. 8-2 | 675 | 3.67 |
| | | Ex. 8-3 | 700 | 8.11 |
| Ex. 9 | 0.07 | Ex. 9-1 | 650 | 0.54 |
| | | Ex. 9-2 | 675 | 1.28 |
| | | Ex. 9-3 | 700 | 1.31 |
| Ex. 10 | 0.06 | Ex. 10-1 | 650 | 0.81 |
| | | Ex. 10-2 | 675 | 1.69 |
| | | Ex. 10-3 | 700 | 8.16 |
| Ex. 11 | 0.06 | Ex. 11-1 | 650 | 0.08 |
| | | Ex. 11-2 | 675 | 0.13 |
| | | Ex. 11-3 | 700 | 0.24 |
| Ex. 12 | 0.05 | Ex. 12-1 | 650 | 0.07 |
| | | Ex. 12-2 | 675 | 0.12 |
| | | Ex. 12-3 | 700 | 0.22 |
| Ex. 13 | 0.04 | Ex. 13-1 | 650 | 0.08 |
| | | Ex. 13-2 | 675 | 0.10 |
| | | Ex. 13-3 | 700 | 0.19 |

Ex. 1 to 5 are Examples of the present invention, and the coating film is found to be excellent in the heat resistance from a small haze after the heat treatment.

Ex. 6 and 7 are Comparative Examples in which although the TiO$_2$ film was formed by the low temperature plasma CVD method, the plasma power density was low, and a film having a high refractive index could not be obtained.

Ex. 8 to 10 are Comparative Examples in which the TiO$_2$ film was formed by the sputtering method, and cracking or the like occurred on the coating film by the heat treatment, and the haze was significant.

When Ex. 1, 11 and 13 and Ex. 6 are compared, it is found that a TiO$_2$ film having a high refractive index can be obtained when the plasma power density is at least 55 kW/m in the low temperature plasma CVD method.

INDUSTRIAL APPLICABILITY

According to the present invention, it is possible to provide a glass substrate provided with a coating film having a high refractive index titania layer which is excellent in the heat resistance with cracking or the like by heat treatment suppressed, and which has desired optical properties, and a method for producing such a glass substrate provided with a coating film. The present invention is useful to provide a glass substrate provided with a coating film having an optical multilayer film such as a visible light antireflection film, an infrared reflective film or an ultraviolet reflective film.

This application is a continuation of PCT Application No. PCT/JP2015/062145, filed on Apr. 21, 2015, which is based upon and claims the benefit of priority from Japanese Patent Application No. 2014-090368 filed on Apr. 24, 2014. The contents of those applications are incorporated herein by reference in their entireties.

REFERENCE SYMBOLS

10A, 10B: Glass substrate provided with coating film, 11: glass substrate, 12: TiO$_2$-containing layer, 121: first high refractive index layer, 122: second high refractive index layer, 131: first low refractive index layer, 132: second low refractive index layer, 100: plasma source, 110: electrode group, 110A: first electrode, 11B: second electrode, 110C: third electrode, 110D: fourth electrode, 130: alternating current power source, 140: wiring for first polarity, 142: wiring for second polarity, 150 (150A to 150C): space, 190: object to be treated.

What is claimed is:

1. A glass substrate provided with a coating film, comprising:
   a glass substrate; and
   a coating film comprising at least one TiO$_2$-containing layer,
   wherein the at least one TiO$_2$-containing layer has a TiO$_2$ content of from 90 mass % to 99 mass %, has a refractive index of at least 2.20 at a wavelength of 632 nm, comprises at least one member selected from the group consisting of an alkoxide type titanium material, an amide type titanium material, and a halide type titanium material, and is formed by a low temperature plasma CVD method.

2. The glass substrate provided with a coating film according to claim 1, wherein the at least one TiO$_2$-containing layer has a thickness of from 10 to 1,000 nm.

3. The glass substrate provided with a coating film according to claim 1, wherein the coating film has at least one layer having a refractive index of at most 1.60 at a wavelength of 632 nm and alternately laminated with the at least one TiO$_2$-containing layer.

4. The glass substrate provided with a coating film according to claim 1, wherein the at least one TiO$_2$-containing layer comprises at least one member selected from the group consisting of an alkoxide type titanium material and an amide type titanium material.

5. The glass substrate provided with a coating film according to claim 1, wherein the at least one TiO$_2$-containing layer comprises titanium tetraisopropoxide.

6. The glass substrate provided with a coating film according to claim 1, wherein the at least one TiO$_2$-containing layer has the TiO$_2$ content of from 95 mass % to 99 mass %.

7. A method for producing the glass substrate provided with a coating film according to claim 1, comprising:
   forming a TiO$_2$-containing layer on a glass substrate by a low temperature plasma CVD method using a film-forming material containing at least one member selected from the group consisting of an alkoxide type titanium material, an amide type titanium material and a halide type titanium material, at a plasma power density of at least 55 kW/m at a film-forming rate of from 15 to 200 nm·m/min.

8. The method according to claim 7, wherein the $TiO_2$-containing layer has a refractive index of at least 2.20 at a wavelength of 632 nm.

9. The method according to claim 7, further comprising, after the forming of the $TiO_2$-containing layer, subjecting the glass substrate provided with the $TiO_2$-containing layer to heat treatment.

10. The method according to claim 9, wherein the heat treatment is carried out at a temperature of from 600 to 700° C.

11. The method according to claim 7, wherein the film-forming material contains at least one member selected from the group consisting of an alkoxide type titanium material and an amide type titanium material.

12. The method according to claim 11, wherein the film-forming material contains titanium tetraisopropoxide.

13. A glass substrate provided with a coating film, comprising:
   a glass substrate; and
   a coating film comprising at least one $TiO_2$-containing layer,
   wherein the at least one $TiO_2$-containing layer has a $TiO_2$ content of from 90 mass % to 99 mass %, has a refractive index of at least 2.20 at a wavelength of 632 nm, comprises at least one member selected from the group consisting of an alkoxide type titanium material, an amide type titanium material, and a halide type titanium material,
   is subjected to heat treatment at a temperature of at least 600° C. and at most 650° C., and has a haze of at most 0.5%.

14. A glass substrate provided with a coating film, comprising:
   a glass substrate; and
   a coating film comprising at least one $TiO_2$-containing layer,
   wherein the at least one $TiO_2$-containing layer has a $TiO_2$ content of from 90 mass % to 99 mass %, has a refractive index of at least 2.20 at a wavelength of 632 nm, comprises at least one member selected from the group consisting of an alkoxide type titanium material, an amide type titanium material, and a halide type titanium material,
   is subjected to heat treatment at a temperature of higher than 650° C. and at most 700° C., and has a haze of at most 1%.

* * * * *